United States Patent [19]

Inohana

[11] Patent Number: 5,179,352
[45] Date of Patent: Jan. 12, 1993

[54] AMPLIFIER WITH DISTORTION REDUCING FEEDBACK

[75] Inventor: Haruyuki Inohana, Saitama, Japan

[73] Assignee: Pioneer Electronic Corporation, Tokyo, Japan

[21] Appl. No.: 791,167

[22] Filed: Nov. 13, 1991

[30] Foreign Application Priority Data

Jun. 17, 1991 [JP] Japan ................. 3-144886

[51] Int. Cl.$^5$ .............................. H03F 1/32
[52] U.S. Cl. ........................ 330/85; 330/265
[58] Field of Search ............... 330/69, 149, 255, 260, 330/262, 263, 265, 85, 136

[56] References Cited

U.S. PATENT DOCUMENTS

| | | | |
|---|---|---|---|
| 3,969,682 | 7/1976 | Rossum | 330/260 X |
| 3,980,967 | 9/1976 | Seidel | 330/85 X |
| 4,970,470 | 11/1990 | Gosser | 330/255 X |

Primary Examiner—Steven Mottola
Attorney, Agent, or Firm—Sughrue, Mion, Zinn, Macpeak & Seas

[57] ABSTRACT

An amplifier device comprises an amplifier circuit, a differential amplifier for amplifying the difference between an input and an output of the amplifier circuit with an amplification degree which is substantially equal to one, and an addition circuit for adding an input signal to an output signal of the differential amplifier circuit and applying the result of addition to the input terminal of the amplifier circuit. Thereby, the distortion of the amplifier circuit is eliminated, and the input signal and the output signal coincide with each other. Hence, by applying the technical concept of the invention to an amplifier with a feedback loop, the distortion factor can be reduced without the increasing of the amount of feedback.

4 Claims, 2 Drawing Sheets

AMPLIFIER WITH DISTORTION REDUCING FEEDBACK

BACKGROUND OF THE INVENTION

This invention relates to an amplifier device.

FIG. 4 shows an example of a conventional amplifier device. In the amplifier, the output signal of a signal source 1 is supplied through an input terminal 2 to the positive input terminal (+) of a differential amplifier 3 having an amplification degree G, and the output of the differential amplifier 3 is applied to an output buffer amplifier 4 having an amplification degree A. The output of the output buffer amplifier 4 is applied through a feedback circuit 5 having an amplification degree B to the negative input terminal (−) of the differential amplifier 3 and is applied through an output terminal 6 to a load RL.

In the amplifier device thus arranged, the amount of feedback corresponds to the product of the amplification degrees of G, A and B. As the amount of feedback increases, the distortion is decreased. However, since it is necessary for the amplifier device to have a certain oscillation margin, there is an upper limit for the amount of feedback, and accordingly it is difficult to sufficiently decrease the distortion.

SUMMARY OF THE INVENTION

Accordingly, an object of the invention is to provide an amplifier device in which the distortion can be decreased sufficiently.

An amplifier device according to this invention comprises: an amplifier circuit; a differential amplifier for amplifying the difference between the input and output signals of the amplifier circuit by an amplification degree which is substantially equal to one; and an addition circuit for adding an input signal to an output signal of the differential amplifier circuit, and applying the result of addition to the input terminal of the amplifier circuit.

In the amplifier device of the invention, the output of the differential amplifier adapted to amplify the difference between the input and output signals of the amplifier circuit is applied to the addition circuit, where it is added to an input signal of applied to the addition circuit, whereby the non-linearity of the transfer characteristic of the amplifier circuit is corrected, and accordingly the output signal includes no distortion.

DESCRIPTION OF PREFERRED EMBODIMENT

An example of an amplifier device, which constitutes one embodiment of this invention, will be described with reference to FIGS. 1 through 3.

Figure 1:
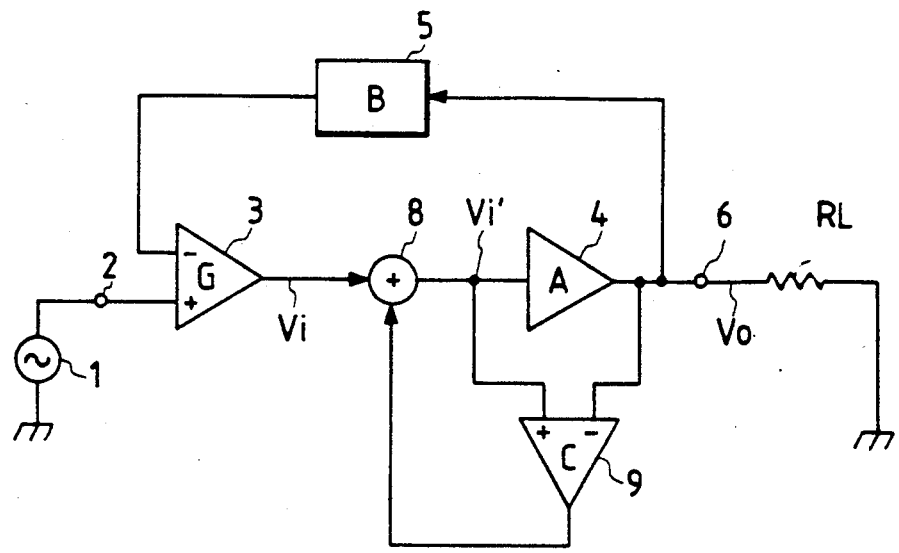
FIG. 1 is a block diagram showing one example of an amplifier device which constitutes one embodiment of this invention.
Figure 4:
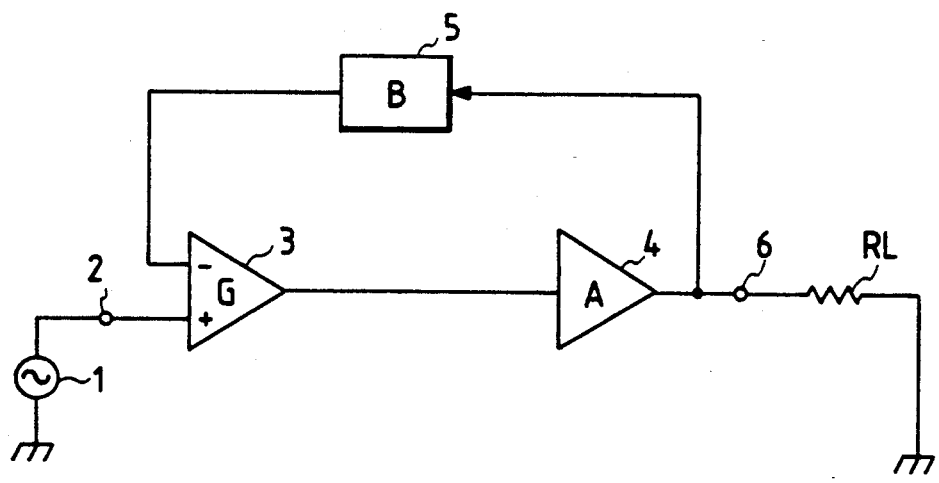
FIG. 4 is a block diagram showing an example of a conventional amplifier device.

In FIG. 1, a differential amplifier 3, a feedback circuit 5 and a load RL are connected in the same manner as in FIG. 4. The output of the differential amplifier 3 is applied to one of the two input terminals of an addition circuit 8, to the other input terminal of which the output of another differential amplifier 9 is applied. The positive input terminal (+) of the differential amplifier 9 is connected to the input terminal of an output buffer amplifier 4, and the negative input terminal (−) of the differential amplifier 9 is connected to the output terminal of the output buffer amplifier 4. The output terminal of the addition circuit 8 is connected to the input terminal of the output buffer amplifier 4.

For the amplifier device thus arranged, the following Equations (1) and (2) are established:

$$Vi' = (Vi' - Vo)C + Vi \tag{1}$$

$$Vo = A\, Vi' \tag{2}$$

where A is the amplification degree of the output buffer amplifier 4, C is the amplification degree of the differential amplifier 9, Vi is the output of the differential amplifier 3, Vi' is the output of the addition circuit 8, and Vo is the output signal applied to the output terminal 6.

When Equation (1) is solved for Vi', the following Equation (3) is obtained:

$$Vi' = (Vi - Vo\, C)/(1 - C) \tag{3}$$

By inserting Equation (3) into Equation (2), the following Equation (4) is obtained:

$$Vo = A\,(Vi - Vo\, C)/(1 - C) \tag{4}$$

By modifying Equation (4), the following Equation (5) is obtained:

$$Vo/Vi = A/(1 - C + A\cdot C) \tag{5}$$

When C (the amplification degree of the differential amplifier) is set to 1 in Equation (5), then Vo/Vi=1. In this case, the distortion which attributes to the amplification degree of A of the output buffer amplifier becomes zero.

In the amplifier device shown in FIG. 1, the distortion, when the feedback loop which is formed by the differential amplifier 3, the addition circuit 8, the output buffer amplifier 4 and the feedback circuit 5 is opened, is compressed to 1/{1+(amount of feedback)} when the feedback loop is closed. Hence, the distortion factor can be decreased by increasing the amount of feedback. However, it is impossible to sufficiently decrease the distortion factor by means of the above-described feedback loop only, because the oscillation margin is decreased as the amount of feedback increases. However, since the output buffer amplifier can be theoretically zeroed in distortion, the amount of distortion is greatly decreased which is provided when the feedback loop is opened. Thus, in the amplifier device of FIG. 1, the distortion factor can be sufficiently decreased without the great increasing of the amount of feedback.

Figure 2:
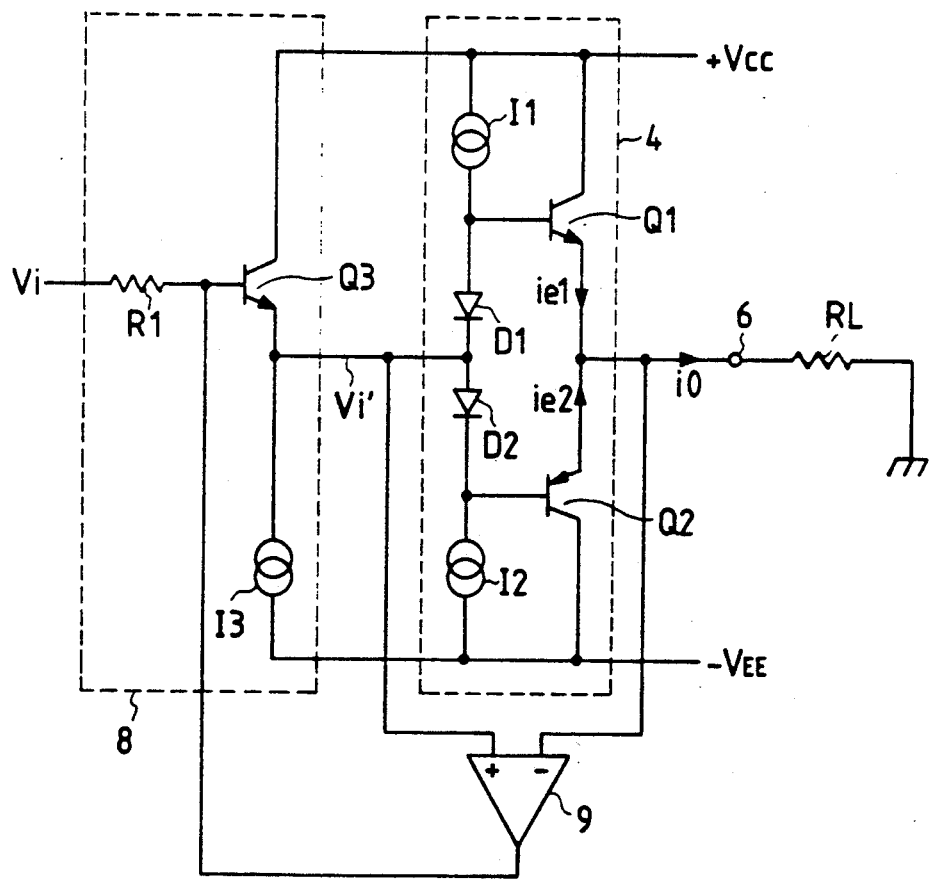
FIG. 2 is a circuit diagram showing circuits elements in the amplifier device in detail.
Figure 3:
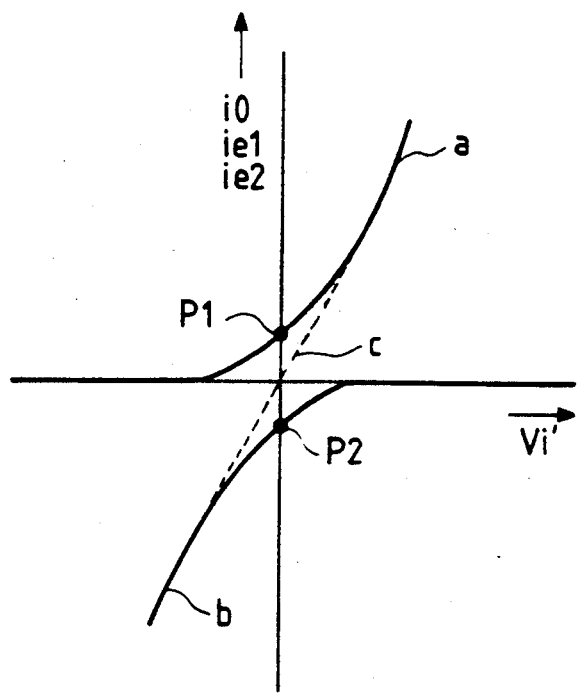
FIG. 3 is a graphical representation for a description of the operations of the circuit elements shown in FIG. 2.

FIG. 2 is a circuit diagram showing part of the amplifier device of FIG. 1 in detail. More specifically, FIG. 2 shows the addition circuit 8, the output buffer amplifier 4, the differential amplifier 9, the output terminal 6, and the load 7. In FIG. 2, the input signal Vi is applied to one terminal of a resistor R1 in the addition circuit. The other terminal of the resistor R1 is connected to the base electrode of an NPN transistor Q3, and to the output terminal of the differential amplifier 9 which is adapted to amplify the input-output potential difference of the output buffer amplifier 4. With the aid of the resistor R1, the input signal Vi is added to the output of the differential amplifier 9.

A supply voltage $+V_{cc}$ is applied to the collector electrode of the transistor Q3. A constant current source I3 is connected between the emitter electrode of the transistor Q3 and a line for supplying a supply voltage $-V_{EE}$. The transistor Q3 and the constant current source I3 form an emitter follower amplifier. This emitter follower amplifier subjects the output of addition by the resistor R1 to buffer amplification. The output of the emitter follower amplifier is applied to the output buffer amplifier 4.

The output buffer amplifier 4 is a complementary push-pull amplifier comprising an NPN transistor Q1, a PNP transistor Q2, constant current sources I1 and I2, and diodes D1 and D2. The emitter electrodes of the NPN transistor Q1 and the PNP transistor Q2 are connected to the output terminal 6 and to the negative input terminal (−) of the differential amplifier 9. The supply voltage $+V_{cc}$ is applied to the collector electrode of the transistor Q1, while the supply voltage 31 $V_{EE}$ is applied to the collector of the transistor Q2. The series circuit of the diodes D1 and D2 for base bias is connected between the base electrodes of the transistors Q1 and Q2. The constant current source I1 is connected between the base electrode of the transistor Q1 and the line for supplying the supply voltage $+V_{cc}$, while the constant current source I2 is connected between the base electrode of the transistor Q2 and the line for supplying the supply voltage $-V_{EE}$. With the aid of the diodes D1 and D2 and the constant current sources I1 and I2, bias voltages are applied to the base electrodes of the transistors Q1 and Q2 to allow idle currents to flow in the transistors Q1 and Q2. The connecting point of the diodes D1 and D2 is the input terminal of the output buffer amplifier 4. The output of the addition circuit 8 is applied to the connecting point of the diodes D1 and D2 and to the positive input terminal (+) of the differential amplifier 9.

The differential amplifier 9 has a voltage-to-current conversion function, and it is so designed as to meet the following condition:

$$gm1.R1 = 1$$

where gm1 is the mutual conductance of the differential amplifier, and R1 is the value of the resistor R1 in the addition circuit. Thus, depending on the mutual conductance gm1, the action takes place which is substantially equal to that in the case where the differential amplifier 9 has no voltage-to-current conversion function and its amplification degree is one (1).

It is assumed that, in the amplifier device thus designed, the input voltage applied to the input terminal of the output buffer amplifier 4 is represented by Vi'; the emitter currents of the transistors Q1 and Q2, by ie1 and ie2, respectively; and the current flowing in the load RL, by io. The relationships between Vi', ie1, ie2 and io are as indicated in FIG. 3, a graphical representation. In FIG. 3, the solid line a is a characteristic curve indicating the relationships between Vi' and ie1, the solid line b is a characteristic curve indicating the relationships between Vi' and ie2, and the broken line c is a characteristic curve indicating the relationships between Vi' and io. Further in FIG. 3, the points P1 and P2 indicate the idle currents for the emitter currents ie1 and ie2, respectively. The idle currents are equal in magnitude to each other, but are opposite to each other. When the idle currents are small in value, the non-linearity of the characteristic curves indicating the relationships between Vi' and ie1 and between Vi' and ie2 affects the characteristic curve indicating the relationships between Vi' and io; that is, a so-called "cross-over distortion" is increased, as is well known in the art. However, with the differential amplifier 9 and the addition circuit 8, the cross-over distortion can be eliminated completely.

As was described above, in the amplifier device according to the invention, the output of the differential amplifier adapted to amplify the difference between the input and output signals of the amplifier circuit is added to the input signal with the aid of the adder, thereby to eliminate the distortion of the amplifier circuit. Hence, in the amplifier device, in order to decrease the amount of distortion, it is unnecessary to increase the amount of feedback thereby to decrease the oscillation margin. Furthermore, in the amplifier device according to the invention, the cross-over distortion can be decreased without the increasing of the idle currents in the complementary push-pull amplifier. Hence, the amplifier device of the invention can be effectively applied to a complementary push-pull amplifier which is limited in the use of current because of heat radiation design.

What is claimed is:

1. An amplifier device comprising:
   a first differential amplifier whose inputs are connected to an input signal source and the output of a feedback circuit;
   an output buffer amplifier circuit whose output is an amplifier device output signal and whose output is also connected to an input of said feedback circuit;
   a second differential amplifier for amplifying the difference between an input and an output of said output buffer amplifier circuit with an amplification degree which is substantially equal to one; and
   an addition circuit for adding an output signal of said first differential amplifier to an output signal of said second differential amplifier circuit, and applying the result of addition to the input of said output buffer amplifier circuit.

2. An amplifier device as claimed in claim 1, wherein said second differential amplifier circuit comprises: a voltage-to-current converter having a predetermined mutual conductance, for converting an input voltage into a current; and said addition circuit comprises: a resistor connected between the output terminal of said second differential amplifier circuit and the input terminal of said output buffer amplifier circuit, the product of said mutual conductance and resistance of said resistor is substantially equal to one.

3. An amplifier device as claimed in claim 1, wherein said output buffer amplifier circuit comprises a complementary push-pull amplifier comprising an NPN transistor, a PNP transistor, first and second constant current sources, and first and second diodes which are serially connected.

4. An amplifier device as claimed in claim 3, wherein emitter electrodes of the NPN transistor and the PNP transistor are connected to the output terminal and to the negative input terminal (−) of the second differential amplifier, a collector electrode of NPN transistor is connected to positive voltage supply, while a collector electrode of PNP transistor is connected to negative voltage supply, the series circuit of the diodes is connected between the base electrodes of the NPN and PNP transistors, the first constant current source is connected between the base electrode of the NPN transistor and the positive voltage supply, while the second constant current source is connected between the base electrode of the PNP transistor and the negative voltage supply, a connecting point of the first and second diodes is the input terminal of said output buffer amplifier circuit.

* * * * *